United States Patent [19]

Glucina

[11] Patent Number: 5,896,056
[45] Date of Patent: Apr. 20, 1999

[54] ROOT-MEAN-SQUARE CONVERTER METHOD AND CIRCUIT

[75] Inventor: Anthony P. Glucina, West Harbour, New Zealand

[73] Assignee: Texmate, Inc., Vista, Calif.

[21] Appl. No.: 08/980,677

[22] Filed: Dec. 1, 1997

[51] Int. Cl.$^6$ .................................................. G06F 7/556
[52] U.S. Cl. ........................................ 327/348; 327/347
[58] Field of Search .................................. 327/346–349, 327/104

[56] References Cited

U.S. PATENT DOCUMENTS

| | | | |
|---|---|---|---|
| 3,723,845 | 3/1973 | Duckworth | 327/348 |
| 3,911,359 | 10/1975 | Metcalf | 327/348 |
| 4,575,649 | 3/1986 | Gardiner et al. | 327/348 |
| 5,012,181 | 4/1991 | Eccleston | 324/74 |
| 5,055,773 | 10/1991 | Thomas et al. | 324/132 |
| 5,117,180 | 5/1992 | Swerlein | 324/132 |
| 5,144,226 | 9/1992 | Rapp | 324/132 |
| 5,150,324 | 9/1992 | Takasuka et al. | 364/807 |
| 5,325,399 | 6/1994 | Haspeslagh et al. | 375/28 |
| 5,585,757 | 12/1996 | Frey | 327/348 |

*Primary Examiner*—Toan Tran
*Attorney, Agent, or Firm*—Loyal McKinley Hanson

[57] ABSTRACT

A sampled data, analog computing method and circuit for producing an output voltage $V_{OUT}$ with a magnitude proportional to the root-mean-square value $V_{RMS}$ of a monopolar input voltage $V_{DC}$, first demodulates or chops a time-varying monopolar input voltage $V_{DC}$ of interest to produce a demodulated or chopped voltage $V_{CHOP}$, and then filters the chopped voltage $V_{CHOP}$ to produce an output voltage $V_{OUT}$. The chopping operation is conducted at a duty ratio or modulation ratio proportional to the ratio of the monopolar input voltage $V_{DC}$ to the output voltage $V_{OUT}$, with the result that the magnitude of the output voltage $V_{OUT}$ is proportional to the root-mean-square value $V_{RMS}$ of the monopolar input voltage $V_{DC}$. The illustrated embodiment of the invention (i) rectifies a time-varying bipolar input voltage $V_{AC}$ of interest with a precision fullwave rectifier to produce the monopolar input voltage $V_{DC}$, (ii) produces a pulse code modulated (PCM) signal with the required duty ratio utilizing an oversampling delta-sigma modulator, and (iii) produces the output voltage $V_{OUT}$ with an inverting second order low pass filter so that $V_{OUT}$ has the inverted polarity and greater magnitude compared to $V_{DC}$ that is required on the delta-sigma modulator reference node.

6 Claims, 4 Drawing Sheets

ROOT-MEAN-SQUARE CONVERTER METHOD AND CIRCUIT

BACKGROUND OF THE INVENTION

1. Technical Field

This invention relates generally to electronic measuring and monitoring circuits and techniques, and more particularly to a method and circuit for producing an analog output signal having a magnitude proportional to the root-mean-square (RMS) value of an analog input signal.

2. Description of Related Art

The RMS value of a time-varying analog voltage indicates the equivalent direct current (DC) voltage in terms of power potential. For a pure sinusoidal waveform, the RMS value can be determined somewhat easily because it equals a known fixed percentage of the peak voltage. But more complex waveforms require more complex measuring techniques. This is important to the measurement industry, particularly the power measurement industry which bases charges for electricity upon RMS values. So, details of the techniques and related circuitry employed to determine the RMS value demand attention.

Perhaps the oldest method for measuring the RMS value of a voltage proceeds by applying the voltage to a filament or semiconductor device. As that is done, the rise in temperature of the device is measured as a direct indication of equivalent power (i.e., heating effect) of the applied voltage. But the need for a thermally insulated chamber and very delicate temperature measuring equipment make this method somewhat undesirable.

Another method for measuring the RMS value proceeds with analog circuitry by employing the logarithmic current-to-voltage characteristic of a forward-biased semiconductor junction. This method proceeds to calculate the RMS value by (i) converting the voltage to a current, (ii) passing the current through the forward-biased semiconductor junction, (iii) doubling the output voltage (equivalent to squaring the current), (iv) integrating the doubled voltage (averaging the squared current), and then (v) taking the antilog of the averaged squared current by applying it to a second forward-biased semiconductor junction opposite to that described above. Accuracy is dependent on how well the semiconductor junctions follow actual logarithmic curves.

The above makes it evident that existing methods for measuring RMS have certain drawbacks that need to be overcome. Thus, the measurement industry needs an improved method and circuit for measuring RMS values, especially of complex waveforms.

SUMMARY OF THE INVENTION

This invention addresses the problems outlined above by providing a sampled data, analog computing method and circuit that chops and filters a time-varying monopolar input voltage $V_{DC}$ of interest to produce an output voltage $V_{OUT}$. The chopping operation is conducted at a duty ratio or modulation ratio proportional to the ratio of the monopolar input voltage $V_{DC}$ to the output voltage $V_{OUT}$. As a result, $V_{OUT}$ is proportional to the root-mean-square value $V_{RMS}$ of $V_{DC}$.

Thus, a thermally insulated chamber is not needed. Delicate temperature measuring equipment is not needed. Accuracy is not dependent on the characteristics of semiconductor junctions, and the circuit may be implemented with operational amplifiers (using hybrid circuitry or chip technology) for improved linearity, less temperature drift, and decreased susceptibility to radio frequency energy (RF).

The invention works as well with a time-varying bipolar voltage $V_{AC}$ of interest by first converting the bipolar voltage $V_{AC}$ to the monopolar input voltage $V_{DC}$. The illustrated embodiment of the invention does that and more. It rectifies the bipolar input voltage $V_{AC}$ with a precision fullwave rectifier to produce the monopolar input voltage $V_{DC}$. It produces a pulse code modulated (PCM) signal with the required duty ratio utilizing a delta-sigma modulator, and it produces the output voltage $V_{OUT}$ with an inverting second order low pass filter so that $V_{OUT}$ has the inverted polarity and greater magnitude (compared to $V_{DC}$) required on the reference node of the delta-sigma modulator.

To paraphrase some of the more precise language appearing in the claims, the invention provides a circuit for producing an output voltage $V_{OUT}$ having a magnitude that is proportional to the root-mean-square value $V_{RMS}$ of a monopolar input voltage $V_{DC}$. Three interconnected subcircuits cooperate to produce the output voltage $V_{OUT}$. The following describes those subcircuits in terms of various subcircuit nodes, interconnections, and transfer characteristics.

The first subcircuit is a demodulator circuit having a demodulator input node connected to the monopolar input voltage $V_{DC}$, a demodulator control signal node, a demodulator output node, and a demodulator transfer characteristic. The second subcircuit is a low pass filter circuit having a low pass filter input node connected to the demodulator output node, a low pass filter output node, and a low pass filter transfer characteristic. The third subcircuit is a pulse code modulator circuit (e.g., a delta-sigma modulator) having a modulator input node connected to the demodulator input node, a modulator reference node connected to the low pass filter output node, a modulator output node connected to the demodulator control signal node, and a modulator transfer characteristic.

Beginning with the demodulator transfer characteristic, it is that of a chopper. The transfer characteristic is such that the demodulator circuit produces a demodulator output voltage $V_{CHOP}$ on the demodulator output node that is proportional to the product of the magnitude of the monopolar input voltage $V_{DC}$ on the demodulator input node and the duty ratio of a pulse code modulated signal $V_{CNTL}$ on the demodulator control signal node.

The low pass filter transfer characteristic is just as straight forward. It is such that the low pass filter circuit produces an output voltage $V_{OUT}$ on the low pass filter output node having a magnitude proportional to the average magnitude of the demodulator output voltage $V_{CHOP}$ on the low pass filter input node.

As for the modulator transfer characteristic, the pulse code modulator circuit produces the pulse code modulated signal $V_{CNTL}$ on the modulator output node, and the demodulator control signal node to which it is connected, so that the pulse code modulated signal $V_{CNTL}$ has the desired duty ratio. The duty ratio is proportional to the ratio of the magnitude of the monopolar input voltage $V_{DC}$ on the modulator input node to the magnitude of the output voltage $V_{OUT}$ on the modulator reference node. As a result, the chopped voltage $V_{CHOP}$ has a magnitude proportional to the square of $V_{DC}$ over $V_{OUT}$ and the output voltage $V_{OUT}$ has a magnitude proportional to the root-mean-square value $V_{RMS}$ of the monopolar input voltage $V_{DC}$.

In line with the above, the claims specify a method for producing an output voltage $V_{OUT}$ whose magnitude is proportional to the root-mean-square value $V_{RMS}$ of a monopolar input voltage $V_{DC}$. The method includes the step of providing a modulator circuit with the nodes and transfer characteristic as described above, and it proceeds by (i) chopping the monopolar input voltage $V_{DC}$ under control of the pulse code modulated signal $V_{CNTL}$ to produce a chopped voltage $V_{CHOP}$, (iii) filtering the chopped voltage $V_{CHOP}$ to produce an output voltage $V_{OUT}$, and (iv) using the monopolar input voltage $V_{DC}$ as the modulator input voltage on the modulator input node, and the output voltage $V_{OUT}$ as the modulator reference voltage on the modulator reference node, so that the pulse code modulated signal $V_{CNTL}$ has a duty ratio proportional to the ratio of the monopolar input voltage $V_{DC}$ to the output voltage $V_{OUT}$.

Doing so results in the magnitude of $V_{OUT}$ being proportional to $V_{RMS}$ of the time-varying monopolar input voltage $V_{DC}$, and one of ordinary skill in the art can readily calibrate the output by suitable known means. The following illustrative drawings and detailed description make the foregoing objects and advantages of the invention apparent along with other objects, features, and advantages.

DESCRIPTION OF THE PREFERRED EMBODIMENT

Figure 1:
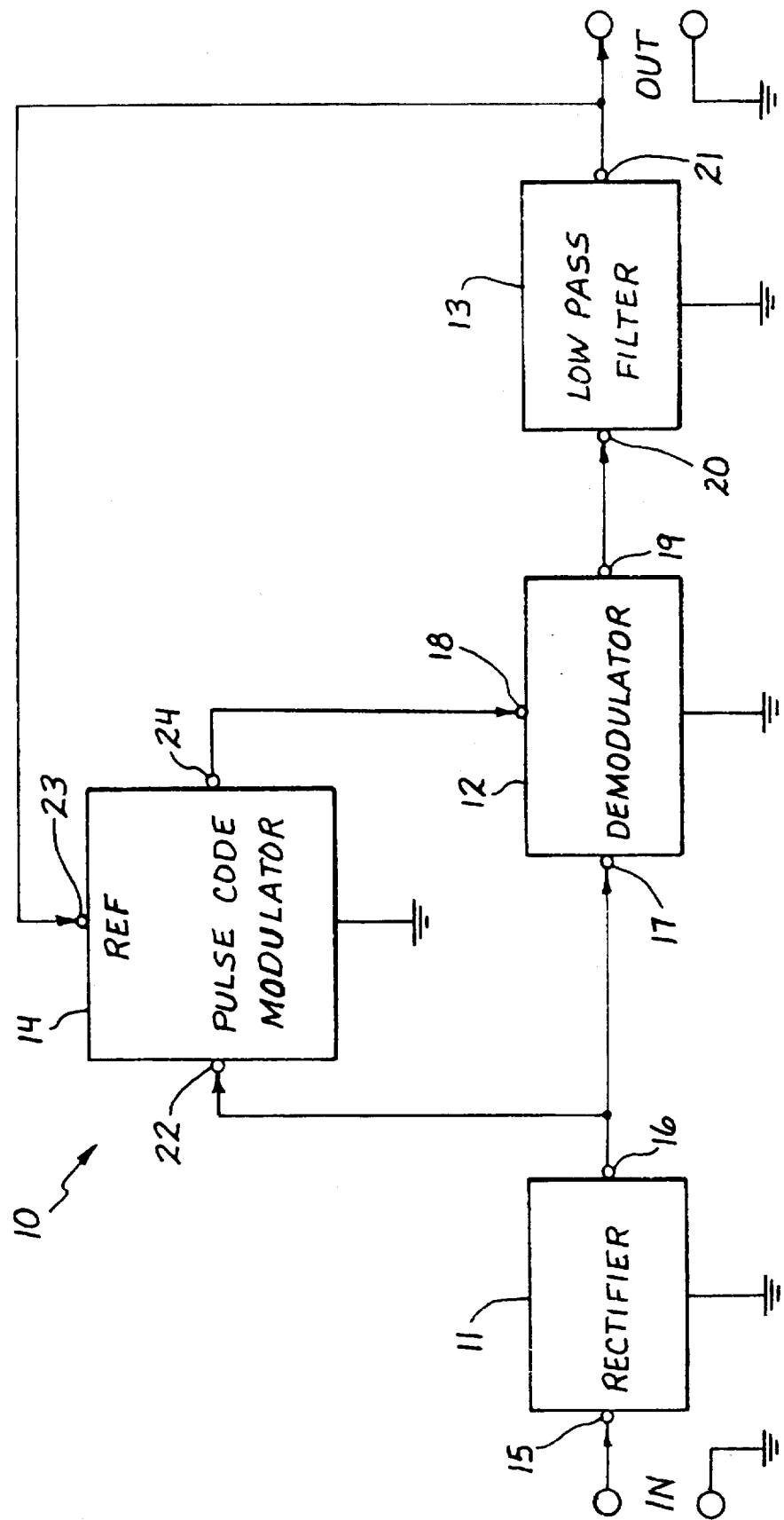
FIG. 1 of the drawings is a block diagram of an RMS converter circuit constructed according to the invention.

FIG. 1 of the drawings is a block diagram of an RMS converter circuit 10 constructed according to the invention. Generally, the circuit 10 includes a rectifier circuit (rectifier 11) followed by a demodulator circuit (demodulator 12), a low pass filter circuit (low pass filter 13), and an pulse code modulator circuit (pulse code modulator 14). Those circuits cooperate to measure the RMS value of a time-varying bipolar voltage $V_{AC}$ coupled to the rectifier 11.

The time-varying bipolar voltage $V_{AC}$ has an instantaneous magnitude that varies between two polarities relative to a common zero voltage reference that is identified in the drawings by the downwardly directed open arrowhead symbols. The bipolar voltage $V_{AC}$ alternates between positive and negative values with a fundamental frequency component (e.g., 50 to 60 Hertz). Depending on waveform complexity, the bipolar voltage $V_{AC}$ may also have harmonically related higher order frequency components up to some highest frequency of significance. It also has an RMS value. The illustrated circuit 10 is designed to accommodate a maximum instantaneous peak-to-peak magnitude of 2.5 volts for the bipolar voltage $V_{AC}$ without exceeding specifications of the operational amplifiers and other circuit elements employed. Higher voltages may be accommodated using suitable scaling components ahead of the rectifier 11 (e.g., a resistive voltage divider).

The rectifier 11 converts the time-varying bipolar voltage $V_{AC}$ to a time-varying monopolar input voltage $V_{DC}$ that is suitable for processing by the rest of the circuit 10. The monopolar input voltage $V_{DC}$ has just one polarity relative to the ground reference. It has a maximum value proportional to the maximum value of $V_{AC}$, and it has an RMS value $V_{RMS}$ that is proportional to the RMS value of the bipolar voltage $V_{AC}$. The proportionality constant for the rectifier 11 equals one, but one of ordinary skill in the art can use some other proportionality constant without departing from the inventive concepts described and claimed.

The rectifier 11 has a rectifier input node 15, a rectifier output node 16, and a rectifier transfer characteristic relating the output on the rectifier output node 16 to an input on the rectifier input node 15. The rectifier transfer characteristic is such that with the bipolar input voltage $V_{AC}$ on the rectifier input node 15, the rectifier circuit 11 produces the monopolar input voltage $V_{DC}$ on the rectifier output node 16 with a magnitude proportional to the absolute value of the magnitude of the input voltage $V_{AC}$, and an RMS valve $V_{RMS}$ proportional to (equal to) the RMS value of the bipolar input voltage $V_{AC}$. For illustrative convenience, the nodes 15 and 16 (and the other nodes discussed) are identified in FIG. 1 by small open circles to which leadlines from the reference numerals extend.

The rest of the circuit 10 concerns itself with the RMS valve $V_{RMS}$ of the monopolar input voltage $V_{DC}$. The demodulator 12 has a demodulator input node 17 connected to the rectifier output node 16, a demodulator control signal node 18, a demodulator output node 19, and the demodulator transfer characteristic specified below. The demodulator transfer characteristic relates the output on the demodulator output node 19 to an input on the demodulator input node 15 and a control signal on the demodulator control signal node 18.

Using similar terminology, the low pass filter 13 has a low pass filter input node 20 connected to the demodulator output node 19, a low pass filter output node 21, and the low pass filter transfer characteristic specified below. The low pass filter transfer characteristic relates the output on the low pass filter output node 21 to an input on the low pass filter input node 20.

The pulse code modulator 14 has a modulator input node 22 connected to the rectifier output node 16, a modulator reference node 23 connected to the low pass filter output node 21, a modulator output node 24 connected to the demodulator control signal node 18, and the modulator transfer characteristic specified below. The modulator transfer characteristic relates the output on the modulator output node 24 to an input on the modulator input node 22 and a reference voltage on the modulator reference node 23.

Concerning the demodulator transfer characteristic, it is such that the demodulator circuit 12 produces a demodulator output voltage $V_{CHOP}$ on the demodulator output node 19 that is proportional to the product of the magnitude of the monopolar input voltage $V_{DC}$ on the demodulator input node 17 and the duty ratio of a two-level pulse code modulated signal $V_{CNTL}$ on the demodulator output node 18. The illustrated demodulator 12 produces $V_{CHOP}$ by switching between first and second states of the demodulator 12 under control of the pulse code modulated signal $V_{CNTL}$. The proportionality constant is one, although one of ordinary skill in the art can use some other proportionality constant without departing from the inventive concepts described and claimed.

During the absence of a pulse on the demodulator control signal node 18 (the first of two levels), the demodulator 12 maintains a first state in which the input node 17 is decoupled from the output input node 19. During the presence of a pulse on the demodulator control signal node 18 (the second of the two levels), the demodulator 12 maintains a second state in which the demodulator input node 17 is coupled to the output node 19. In other words, the demodulator 12 switches from the first state to the second state when the pulse code modulated signal $V_{CNTL}$ switches from the first level to the second level, and then switches back to the first state when $V_{CNTL}$ switches back to the first level. Thus, the demodulator 12 chops $V_{DC}$ at the duty ratio of the pulse code modulated signal $V_{CNTL}$ so that $V_{CHOP}$ is proportional to the product of $V_{DC}$ and the duty ratio of $V_{CNTL}$.

The low pass filter transfer characteristic is just as straight forward. It is such that the low pass filter circuit 13 produces an output voltage $V_{OUT}$ on the low pass filter output node 21 having a magnitude proportional to the average magnitude of the demodulator output voltage $V_{CHOP}$ on the low pass filter input node 20. As discussed later on, the particular low pass filter 13 used in the illustrated circuit 10 is a second order low pass filter circuit configured to invert the polarity and provide gain.

As for the modulator transfer characteristic, the pulse code modulator circuit 14 produces the pulse code modulated signal $V_{CNTL}$ on the modulator output node 24, and the demodulator control signal node 18 to which it is connected, so that the pulse code modulated signal $V_{CNTL}$ has the desired duty ratio. It has a duty ratio proportional to the ratio of the magnitude of the monopolar input voltage $V_{DC}$ on the modulator input node 22 to the magnitude of the output voltage $V_{OUT}$ on the modulator reference node 23. As a result, the chopped voltage $V_{CHOP}$ has a magnitude proportional to the square of $V_{DC}$ over $V_{OUT}$, and the output voltage $V_{OUT}$ has a magnitude proportional to the root-mean-square value $V_{RMS}$ of the monopolar input voltage $V_{DC}$.

Sampled data techniques, including oversampling pulse code modulation, are well known to those of ordinary skill in the art. Among other benefits, oversampling modulators can use simple and relatively high-tolerance analog components to achieve high resolution. They modulate the analog signal into a simple code, usually single-bit words, at a frequency much higher than the Nyquist rate.

Some pulse code modulation varies the duty ratio (or modulation ratio) of a pulse train, while usually maintaining a fixed pulse duration (although as used herein, pulse code modulation includes pulse width modulation). Pulses are produced during various ones of an ongoing series of periodic clock intervals (or clock periods) that occur at a frequency or sampling rate much greater than the Nyquist rate. In the case of pulses having a fixed duration of one clock interval, the duty ratio over any local period of time (e.g., 7–10 clock intervals or more) is the ratio of the number of clock intervals for which a pulse occurs to the total number of clock intervals occurring during that period of time. Stated another way, a pulse code modulated signal switches between a first level (no pulse) and a second level (a pulse), and the duty ratio over a particular period of time is the proportion of that period of time that the signal is at the second level.

These are well known concepts that are discussed here to help develop the language appearing in the claims, and the illustrated circuit 10 uses a well known form of oversampling pulse code modulator called a delta-sigma modulator. One of ordinary skill in the art will recognize the delta-sigma modulator and know how to configure it according to the precise task at hand. Additional information about sigma-delta modulators and related circuitry and techniques appears abundantly in the literature, including the book entitled "Delta-Sigma Data Converters: Theory, Design, and Simulation" that was published in the year 1997 by the Institute of Electrical and Electronic Engineers, Inc. of New York (ISBN 0-7803-1045-4).

Figure 2:
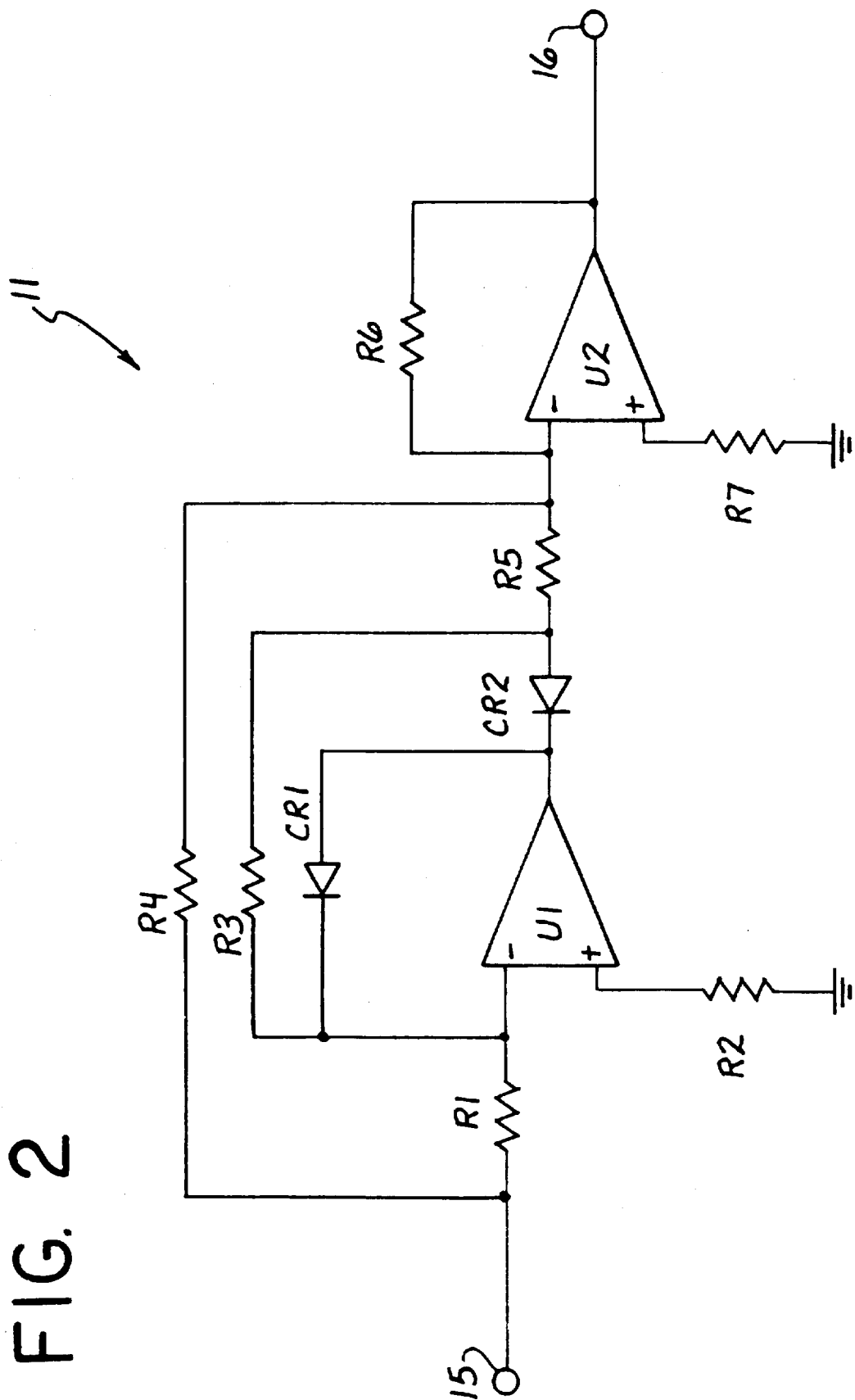
FIG. 2 is a circuit diagram of the particular precision fullwave rectifier used in the illustrated embodiment.
Figure 3:
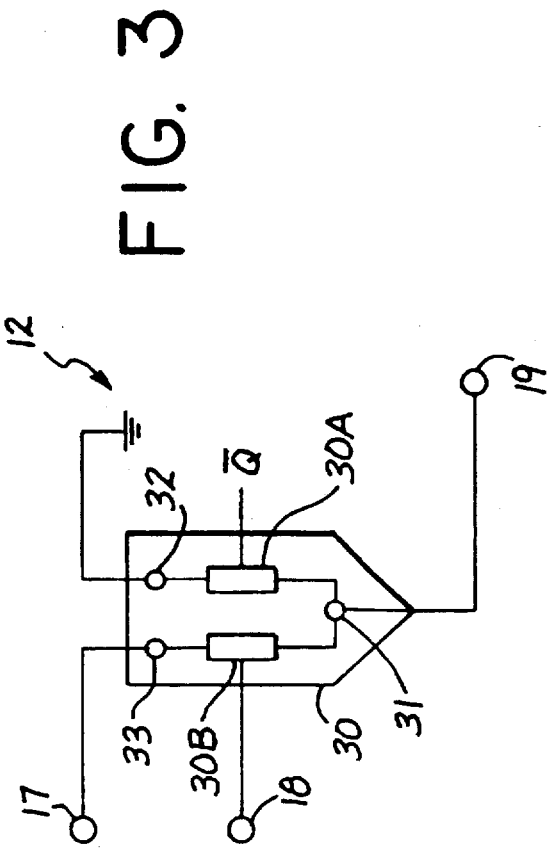
FIG. 3 is a circuit diagram of the demodulator used in the illustrated embodiment.

FIGS. 2–5 provide additional details about the circuit 10. The positive and negative five-volt power supply voltages and related components are omitted for most of the circuit elements for illustrative convenience. First consider the rectifier 11 (FIG. 2). It utilizes two operational amplifiers U1 and U2 (e.g., each one-half of a TC913 component) in a well known precision fullwave rectifier circuit configuration. Two diodes CR1 and CR2 (e.g., two 1N4148 components) combine with four resistors R1, R2, R3, and R4 (e.g., four 32.4 KOhm components), two resistors R5 and R6 (e.g., two 16.2 KOhm components), and one resistor R7 (e.g., a 8.06 KOhm component) to achieve precision fullwave rectification together with one stage of buffering.

Next, consider the demodulator 12. It includes a single pole, double throw (SPDT) switch 30 that is illustrated diagrammatically in FIG. 3. The switch 30 has a single input pole 31 connected to the demodulator output node 19, a first output pole 32 connected to the common zero voltage reference, and a second output pole 33 connected to the demodulator input node 15. Any of various electronic switches may be employed, including two single pole, single throw (SPST) semiconductor switches 30A and 30B of a CD4066 component that are suitably connected together in a SPDT switch configuration.

Figure 5:
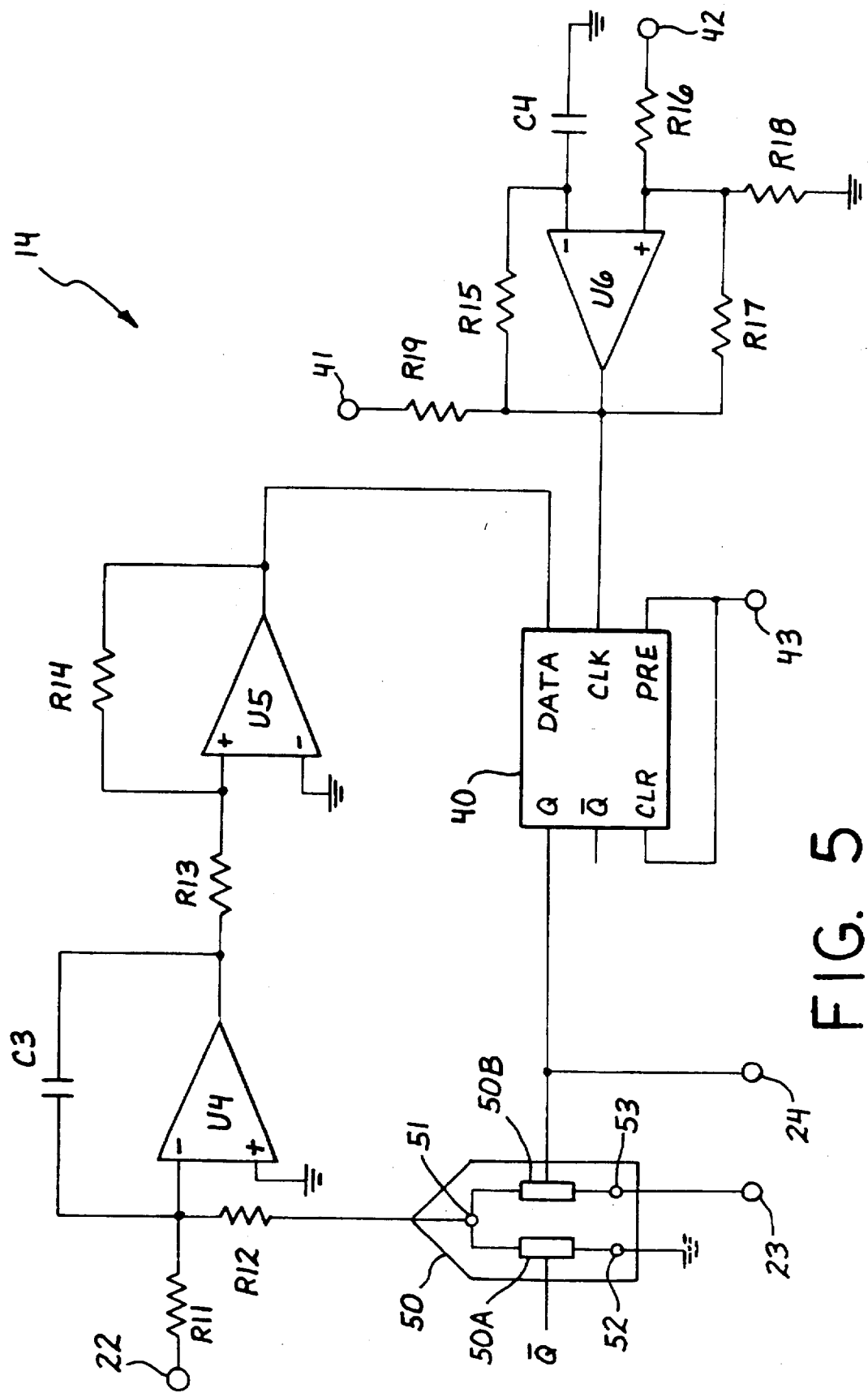
FIG. 5 is a circuit diagram of the delta-sigma pulse code modulator used in the illustrated embodiment.

The switch 30 is actuated under control of the pulse code modulated signal $V_{CNTL}$ on the demodulator control signal node 18 by switching the first semiconductor switch 30A under control of the $\overline{Q}$ output of a flipflop discussed further on with reference to FIG. 5, and by switching the second semiconductor switch 30B under control of the Q output of the flipflop. When the $\overline{Q}$ output is high (the absence of a pulse on the Q output), the switch 30A is activated while the switch 30B is deactivated, thereby connecting the demodulator output node 19 to the common zero voltage reference while disconnecting the demodulator output node 19 from the demodulator input node 17. When the Q output is high (the presence of a pulse), the switch 30B is activated while the switch 30A is deactivated, thereby connecting the demodulator output node 19 to the demodulator input node 17 while disconnecting it from the common zero voltage reference.

Figure 4:
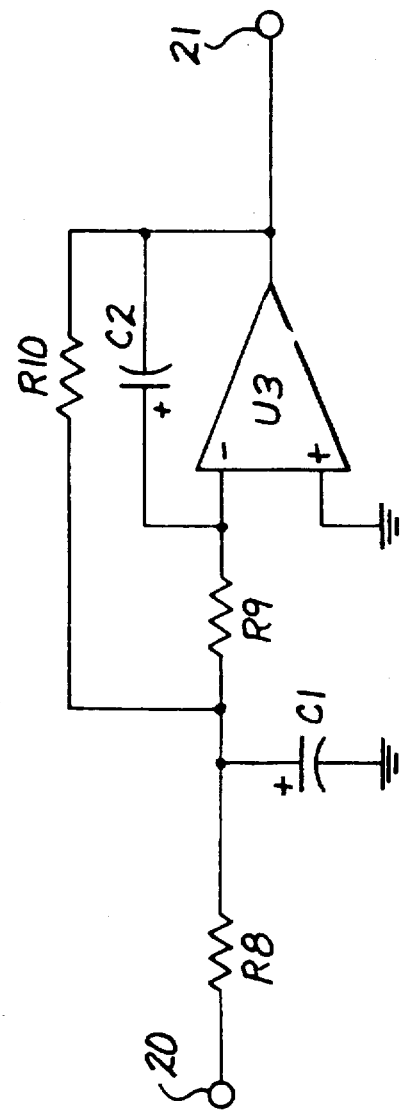
FIG. 4 is a circuit diagram of the inverting second order low pass filter used in the illustrated embodiment.

FIG. 4 shows the low pass filter 13. It utilizes an operational amplifier U3 (e.g., one-half of a TC913 component), two resistors R8 and R9 (e.g., two 49.9 KOhm components), another resistor R10 (e.g., a 221 KOhm component), and two capacitors C1 and C2 (e.g., two 2.2 microfarad components) in a well known second order low pass filter configuration. The low pass filter 13 produces the output voltage $V_{OUT}$ on the low pass filter output node 21 so that it has a polarity reversed from the polarity of the monopolar input voltage $V_{DC}$, and so that $V_{OUT}$ has the magnitude compared to $V_{DC}$ required by the pulse code modulator 14. The ratio of R10 to R8 sets a gain figure for the low pass filter 13 sufficient to give $V_{OUT}$ a magnitude compatible with the pulse code modulator 14.

FIG. 5 shows further details of the pulse code modulator 14. It includes an operational amplifier U4 (e.g., one-half of a TC913 component) outfitted with two input resistors R11 and R12 (e.g., 49.9 KOhm components) and a feedback capacitor C3 (e.g., 1 nanofarad) in a summing integrator configuration of the type often used in a delta-sigma modulator. Another operational amplifier U5 (e.g., one-half of a TC913 component) is outfitted with an input resistors R13 (e.g., a 1 KOhm component) and a feedback resistor R14 to provide buffering and gain in driving the DATA input of a flipflop 40 (e.g., a 74C74 component).

The pulse code modulator 14 includes yet another operational amplifier U6 (e.g., one-half of a TC913 component) in an RC clock configuration having a desired clock rate (e.g., 100 kilohertz) and corresponding clock period or interval (10 microseconds). The operational amplifier U6 is outfitted with four resistors R15, R16, R17, R18 (e.g., four 100 KOhm components) and a single resistor R19 (e.g., a 4.7 KOhm component) that is connected between the output of U6 and a node 41 having a positive power supply voltage on it (e.g., 5 volts). A capacitor C4 (e.g., a 50 picofarad component) is connected between the negative input of U6 and the common zero voltage reference, and the resistor R16 is connected between the positive input of U6 and a node 42 having the positive power supply voltage on it.

The CLK input of the flipflop 40 is connected to the output of U6, while the CLR and PRE inputs are connected to a node 43 having the positive power supply voltage on it. As a result, the Q output of the flipflop 40 switches to a five-volt high logic level (the second of the two levels of the pulse code modulated signal $V_{CNTL}$) at the leading edge of each clock pulse that occurs with the DATA input greater than zero, and switches back to a zero-volt low logic level (the first of the two levels of the pulse code modulated signal $V_{CNTL}$) at the leading edge of each clock pulse that occurs with the DATA input not greater than zero. With the delta-sigma feedback configuration illustrated, that results in a two-level binary signal on the Q output that is the desired pulse code modulated signal $V_{CNTL}$. It is a train of pulses of fixed duration (one clock interval per pulse) and modulated duty ratio.

The Q output of the flipflop 40 is connected to the modulator output node 24, and also to another SPDT switch 50 (e.g., two additional single pole, single throw semiconductor switches 50A and 50B of the CD4066 component used for the switch 30 that are suitably connected together in a SPDT switch configuration). So, the switch 50 changes state accordingly. The switch 50 is illustrated diagrammatically. It has a single input pole 51 connected to the resistor R12, a first output pole 52 connected to the common zero voltage reference, and a second output pole 53 connected to the modulator reference node 23.

The switch 50 is actuated under control of the pulse code modulated signal $V_{CNTL}$ on the Q output of the flipflop 40, the demodulator output node 24, and the switch 50. The first semiconductor switch 50A is switched control of the $\overline{Q}$ output of the flipflop 40, and the second semiconductor switch 50B is switched under control of the Q output of the flipflop 40. When the $\overline{Q}$ output is high (the absence of a pulse on the Q output), the switch 50A is activated while the switch 50B is deactivated, thereby connecting the resistor R12 to the common zero voltage reference while disconnecting it from the modulator reference node 23. When the Q output is high (the presence of a pulse), the switch 50B is activated while the switch 50A is deactivated, thereby connecting the resistor R12 to the modulator reference node 23 while disconnecting it from the common zero voltage reference.

So configured, the modulator 14 operates in a way common to many delta-sigma modulators in that it integrates the difference between the monopolar input voltage $V_{DC}$ and the output of the switch 50. The result of that integration determines the state of the flipflop 40 during each clock interval, and that, in turn, determines the state of the switch 50 during each clock interval, and whether or not the modulator reference node 23 or the common zero voltage reference is connected to the input resistor R12. The Q output of the flipflop 40 thereby becomes the desired pulse code modulated signal.

Based upon the foregoing and subsequent descriptions, one of ordinary skill in the art can readily change the ratio or R11 to R12 to introduce gain in the modulator 14, instead of, or in conjunction with, gain in the low pass filter 13. For the illustrated delta-sigma modulator 14, it is not only necessary that the polarity of the reference voltage on the demodulator reference node 23 be the reverse of the polarity of the monopolar input voltage $V_{DC}$. It is also necessary that the reference voltage (the output $V_{OUT}$ on the low pass filter output node 21 and the modulator reference node 23) have sufficient magnitude to counteract the integration of $V_{DC}$. That allows the output of U4 to decrease when the switch 50 is in the second state. Those details of a delta-sigma modulator are well within the capabilities of one of ordinary skill in the art.

Recapitulating, the method of the invention includes the step of providing a pulse code modulator circuit with the nodes and transfer characteristic as described above with reference to FIG. 1. The method proceeds by (i) chopping the monopolar input voltage $V_{DC}$ under control of the pulse code modulated signal $V_{CNTL}$ to produce a chopped voltage $V_{CHOP}$, (iii) filtering the chopped voltage $V_{CHOP}$ to produce an output voltage $V_{OUT}$, and (iv) using the monopolar input voltage $V_{DC}$ as the modulator input voltage on the modulator input node, and the output voltage $V_{OUT}$ as the modulator reference voltage on the modulator reference node, so that the pulse code modulated signal $V_{CNTL}$ has a duty ratio proportional to the ratio of the monopolar input voltage $V_{DC}$ to the output voltage $V_{OUT}$. Doing so results in the magnitude of $V_{OUT}$ being proportional to $V_{RMS}$ of the time-varying monopolar input voltage $V_{DC}$.

A thermally insulated chamber is not needed. Delicate temperature measuring equipment is not needed. Accuracy is not dependent on the characteristics of semiconductor junctions. The circuit may be implemented with operational amplifiers (using hybrid circuitry or chip technology) for improved linearity, less temperature drift, and decreased susceptibility to radio frequency energy (RF), and the invention works as well with a time-varying bipolar voltage $V_{AC}$ of interest by first converting the bipolar voltage $V_{AC}$ to the monopolar input voltage $V_{DC}$. Although an exemplary embodiment has been shown and described, one of ordinary skill in the art may make many changes, modifications, and substitutions without necessarily departing from the spirit and scope of the invention.

What is claimed is:

1. A circuit for producing an output voltage $V_{OUT}$ whose magnitude is proportional to the root-mean-square value $V_{RMS}$ of a time-varying monopolar input voltage $V_{DC}$, the circuit comprising:

a demodulator circuit having a demodulator input node connected to the monopolar input voltage $V_{DC}$, a demodulator control signal node, a demodulator output node, and a demodulator transfer characteristic;

a low pass filter circuit having a low pass filter input node connected to the demodulator output node, a low pass filter output node, and a low pass filter transfer characteristic; and a pulse code modulator circuit having a modulator input node connected to the demodulator input node, a modulator reference node connected to the low pass filter output node, a modulator output node connected to the demodulator control signal node, and a modulator transfer characteristic;

the demodulator transfer characteristic being such that the demodulator circuit produces a demodulator output voltage $V_{CHOP}$ on the demodulator output node that is proportional to the product of the magnitude of the monopolar voltage $V_{DC}$ on the demodulator input node and a duty ratio of a pulse code modulated signal $V_{CNTL}$ on the demodulator control signal node;

the low pass filter transfer characteristic being such that the low pass filter circuit produces an output voltage $V_{OUT}$ on the low pass filter output node having an average magnitude proportional to the average magnitude of the demodulator output voltage $V_{CHOP}$ on the low pass filter input node; and the modulator transfer characteristic being such that the pulse code modulator circuit produces the pulse code modulated signal $V_{CNTL}$ on the modulator output node, and the demodulator control signal node to which the modulator output node is connected, so that the pulse code modulated signal $V_{CNTL}$ has a duty ratio proportional to the ratio of the magnitude of the monopolar voltage $V_{DC}$ on the modulator input node to the magnitude of the output voltage $V_{OUT}$ on the modulator reference node;

thereby resulting in the output voltage $V_{OUT}$ being proportional to the root-mean-square value $V_{RMS}$ of the time-varying monopolar input voltage $V_{DC}$.

2. A circuit as recited in claim 1, wherein the modulator circuit includes a delta-sigma modulator.

3. A circuit as recited in claim 1, wherein the low pass circuit includes an inverting second order low pass filter.

4. A circuit for producing an output voltage $V_{OUT}$ whose magnitude is proportional to the root-mean-square value of a time-varying bipolar input voltage $V_{AC}$, the circuit comprising:

a rectifier circuit having a rectifier input node connected to the bipolar input voltage $V_{AC}$, a rectifier output node, and a rectifier transfer characteristic;

a demodulator circuit having a demodulator input node connected to the rectifier output node, a demodulator control signal node, a demodulator output node, and a demodulator transfer characteristic;

a low pass filter circuit having a low pass filter input node connected to the demodulator output node, a low pass filter output node, and a low pass filter transfer characteristic;

a pulse code modulator circuit having a modulator input node connected to the rectifier output node, a modulator reference node connected to the low pass filter output node, a modulator output node connected to the demodulator control signal node, and a modulator transfer characteristic;

the rectifier transfer characteristic being such that with the bipolar input voltage $V_{AC}$ on the rectifier input node, the rectifier circuit produces a monopolar input voltage $V_{DC}$ on the rectifier output node, and on the modulator input node and the demodulator input node to which the rectifier output node is connected, having a magnitude that is proportional to the absolute value of the magnitude of the input voltage $V_{AC}$ and a root-mean-square valve $V_{RMS}$ that is proportional to the root-mean-square value of the bipolar input voltage $V_{AC}$;

the demodulator transfer characteristic being such that the demodulator circuit produces a demodulator output voltage $V_{CHOP}$ on the demodulator output node that is proportional to the product of the magnitude of the monopolar input voltage $V_{DC}$ on the demodulator input node and a duty ratio of a pulse code modulated signal $V_{CNTL}$ on the demodulator control signal node;

the low pass filter transfer characteristic being such that the low pass filter circuit produces an output voltage $V_{OUT}$ on the low pass filter output node having an average magnitude proportional to the average magnitude of the demodulator output voltage $V_{CHOP}$ on the low pass filter input node; and the pulse code modulator transfer characteristic being such that the pulse code modulator circuit produces the pulse code modulated signal $V_{CNTL}$ on the modulator output node, and the demodulator control signal node to which the modulator output node is connected, so that the pulse code modulated signal $V_{CNTL}$ has a duty ratio proportional to the ratio of the magnitude of the monopolar input voltage $V_{DC}$ on the modulator input node to the magnitude of the output voltage $V_{OUT}$ on the modulator reference node;

thereby resulting in the output voltage $V_{OUT}$ being proportional to the root-mean-square value $V_{RMS}$ of the time-varying monopolar input voltage $V_{DC}$ and to the root-mean-square value of the time-varying bipolar input voltage $V_{AC}$.

5. A method for producing an output voltage $V_{OUT}$ having a magnitude proportional to the root-mean-square value $V_{RMS}$ of a time-varying monopolar input voltage $V_{DC}$, the method comprising:

providing a pulse code modulator circuit having a modulator input node, a modulator reference node, a modulator output node, and a modulator transfer characteristic such that the pulse code modulator circuit produces a pulse code modulated signal $V_{CNTL}$ on the modulator output node having a duty ratio proportional to the ratio of the magnitude of an in put voltage on the modulator input node to the magnitude of the a reference voltage on the modulator reference node;

chopping the monopolar input voltage $V_{DC}$ under control of the pulse code modulated signal $V_{CNTL}$ to produce a chopped voltage $V_{CHOP}$;

filtering the chopped voltage $V_{CHOP}$ to produce an output Voltage $V_{OUT}$; and operating the pulse code modulator with the monopolar input voltage $V_{DC}$ as the modulator input voltage on the modulator input node and the output voltage $V_{OUT}$ as the modulator reference voltage on the modulator reference node so that the pulse code modulated signal $V_{CNTL}$ has a duty ratio proportional to the ratio of the magnitude of the monopolar input voltage $V_{DC}$ to the magnitude of the output voltage $V_{OUT}$.

6. A method for producing an output voltage $V_{OUT}$ having a magnitude proportional to the root-mean-square value $V_{RMS}$ of a time-varying bipolar input voltage $V_{AC}$, the method comprising:

providing a pulse code modulator circuit having a modulator input node, a modulator reference node, a modulator output node, and a modulator transfer characteristic such that the pulse code modulator circuit produces a pulse code modulated signal $V_{CNTL}$ on the modulator output node having a duty ratio proportional to the ratio of the magnitude of an input voltage on the modulator input node to the magnitude of the a reference voltage on the modulator reference node;

rectifying the bipolar input voltage $V_{AC}$ to produce a monopolar input voltage $V_{DC}$ having a magnitude that is proportional to the absolute value of the magnitude of the input voltage $V_{AC}$ and having a root-mean-square valve $V_{RMS}$ that is proportional to the root-mean-square value of the bipolar input is voltage $V_{AC}$;

chopping the monopolar input voltage $V_{DC}$ under control of the pulse code modulated signal $V_{CNTL}$ to produce a chopped voltage $V_{CHOP}$;

filtering the chopped voltage $V_{CHOP}$ to produce an output voltage $V_{OUT}$; and operating the pulse code modulator with the monopolar input voltage $V_{DC}$ on the modulator input node and the output voltage $V_{OUT}$ on the modulator reference node so that the pulse code modulated signal $V_{CNTL}$ has a duty ratio proportional to the ratio of the magnitude of the monopolar input voltage $V_{DC}$ to the magnitude of the output voltage $V_{OUT}$.

* * * * *